(12) United States Patent
Murakami et al.

(10) Patent No.: US 6,522,716 B1
(45) Date of Patent: Feb. 18, 2003

(54) MULTILAYER-FILM REFLECTIVE MIRRORS, EXTREME UV MICROLITHOGRAPHY APPARATUS COMPRISING SAME, AND MICROELECTRONIC-DEVICE MANUFACTURING METHODS UTILIZING SAME

(75) Inventors: Katsuhiko Murakami, Sagamihara (JP); Yutaka Ichihara, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/684,873

(22) Filed: Oct. 6, 2000

(30) Foreign Application Priority Data

Oct. 8, 1999 (JP) .......................................... 11-287767

(51) Int. Cl.[7] ................................................. G21K 5/00
(52) U.S. Cl. ............................. 378/34; 378/35; 378/84; 378/85
(58) Field of Search ............................. 378/34, 35, 84, 378/85

(56) References Cited

U.S. PATENT DOCUMENTS

| | | | |
|---|---|---|---|
| 5,063,586 A | | 11/1991 | Jewell et al. |
| 5,182,763 A | * | 1/1993 | Iizuka et al. ................... 378/34 |
| 5,315,629 A | | 5/1994 | Jewell et al. |
| 5,815,310 A | | 9/1998 | Williamson |
| 6,072,852 A | * | 6/2000 | Hudyma ....................... 378/84 |
| 6,266,389 B1 | * | 7/2001 | Murayama et al. ........... 378/34 |

OTHER PUBLICATIONS

Tichenor et al., "Recent Results in the Development of an Integrated EUVL Laboratory Tool," *SPIE* 2437:292–307 (1995).

Hawryluk et al., "Soft x–ray projection lithography using an x–ray reduction camera", *J. Vac. Sci. Technol.* B6(6):2162–2166, 1988.

Kinoshita et al., "Soft x–ray reduction lithography using multilayer mirror," *J. Vac. Sci. Technol.* B7(6):1648–1651, 1989.

Hawryluk et al., "Wavelength considerations in soft x–ray projection lithography," *Applied Optics,* 32(34)B:7062–7067, 1993.

\* cited by examiner

Primary Examiner—David P. Porta
Assistant Examiner—Therese Barber
(74) *Attorney, Agent, or Firm*—Klarquist Sparkman LLP

(57) ABSTRACT

Microlithography apparatus and methods are disclosed for achieving high-resolution pattern transfer of a pattern onto a substrate, such as a semiconductor wafer, using extreme ultraviolet (EUV, also termed soft X-ray) radiation. The apparatus include an imaging-optical system (projection-optical system) capable of receiving pattern-encoding EUV light from a mask and forming an image of the pattern on the substrate. The desired wavelength of the EUV light is 20 nm to 50 nm, and the imaging-optical system includes multiple reflective mirrors having aspherical surficial profiles and multilayer-film reflective surfaces. The apparatus are configured especially to achieve a pattern-element resolution, of the projected image, of 70 nm or finer.

16 Claims, 10 Drawing Sheets

MULTILAYER-FILM REFLECTIVE MIRRORS, EXTREME UV MICROLITHOGRAPHY APPARATUS COMPRISING SAME, AND MICROELECTRONIC-DEVICE MANUFACTURING METHODS UTILIZING SAME

FIELD OF THE INVENTION

This invention pertains to microlithography (projection-transfer of a pattern, defined by a reticle or mask, onto a substrate). Microlithography is a key technology used in the manufacture of microelectronic devices such as integrated circuits, displays, and the like. More specifically, this invention pertains to microlithography performed using so-called "soft X-rays" (SXR), also known as "extreme ultraviolet" (EUV) radiation (these two terms are used interchangeably herein). Even more specifically, the invention pertains to multilayer mirrors that are reflective to soft X-rays, as used in microlithography apparatus employing SXR (EUV) radiation, and to image formation in the SXR (EUV) band.

BACKGROUND OF THE INVENTION

In recent years in response to the ever-increasing miniaturization and densification of microelectronic circuit elements as used in, for example, semiconductor integrated circuits, microlithography apparatus and methods have been developed that employ a soft X-ray beam as an energy beam in order to achieve better resolution of circuit elements. Soft X-ray (SXR) radiation has a wavelength generally within the range of 11 nm to 14 nm, which is significantly shorter than the radiation used to date (up to deep ultraviolet) in optical microlithography. In other words, microlithography technology used to date is compromised by diffraction limits, which prevent obtaining ever increasing resolution (e.g., see Tichenor et al., *Proc. SPIE* 2437:292, 1995).

SXR microlithography (also termed herein "extreme ultraviolet," or EUV microlithography) offers prospects of attaining better resolution of circuit features than current microlithography technology. Specifically, EUV microlithography is hailed as the "microlithography of the future," capable of achieving resolutions of about 70 nm and smaller, which cannot be achieved using so-called "optical microlithography" (performed using a wavelength of about 190 nm or more).

With EUV wavelengths, the refractive index of substances is extremely close to unity. As a result, conventional optical elements for achieving refraction and/or reflection of optical wavelengths cannot be used. Instead, grazing-incidence mirrors or multilayer-film mirrors typically are used. Grazing-incidence mirrors achieve total reflection with a refractive index of slightly less than unity, and multilayer-film mirrors achieve a high overall reflectivity by passing weakly reflected light through multiple phase-matched convolutions. For example, a reflectivity of 67.5% can be obtained of a normal incident beam having a wavelength of about 13.4 nm using a reflective mirror comprising a Mo/Si multilayer film, in which molybdenum (Mo) layers and silicon (Si) layers are alternately laminated. A reflectivity of 70.2% can be obtained of a directly incident beam having a wavelength of about 11.3 nm using a reflective mirror comprising a Mo/Be multilayer film, in which Mo layers and beryllium (Be) layers are alternately laminated. E.g., see Montcalm, *Proc. SPIE* 3331:42, 1998.

Conventional soft X-ray microlithography apparatus comprise a soft X-ray source, an illumination-optical system, a mask stage, an imaging-optical (projection-optical) system, and a substrate stage. The SXR source can be a laser-plasma source, a discharge-plasma source, or a synchrotron-radiation source. The illumination-optical system comprises grazing-incidence mirrors each having a respective reflective surface that reflects SXR radiation that is obliquely incident to the reflective surface, multilayer-film mirrors each having a reflective surface are formed by a multilayer film, and a filter that transmits only SXR radiation of a specified wavelength. Thus, the mask is illuminated by SXR radiation having a desired wavelength.

Since no known substances are transparent to SXR radiation, the mask is a so-called "reflective mask" rather than a conventional transmission-type mask. The imaging-optical system comprises multiple multilayer-film mirrors, and is configured to form an image, of the irradiated region of the mask, on the substrate (e.g., semiconductor wafer) to which a layer of a suitable resist has been applied. Thus, the image is transferred to the layer of resist. Since SXR radiation is absorbed and attenuated by the atmosphere, the SXR light path in the microlithography apparatus normally is maintained at a certain vacuum (e.g., $1 \times 10^{-5}$ Torr or less).

As noted above, the imaging-optical system comprises multiple multilayer-film mirrors. Since the reflectivity of a multilayer-film mirror is not 100 percent, the imaging-optical system desirably consists of as few such mirrors as possible to minimize light loss. Thus far, imaging-optical systems comprising four multilayer-film mirrors (e.g., Jewell and Thompson, U.S. Pat. No. 5,315,629; and Jewell, U.S. Pat. No. 5,063,586) and six multilayer-film mirrors (e.g., Williamson, U.S. Pat. No. 5,815,310) have been reported. Unlike refractive optical systems through which a light flux propagates in one direction, reflective optical systems are characterized by the doubling back of the light flux on itself within the optical system. Hence, it is difficult to obtain a large numerical aperture (NA) due to restrictions such as avoiding eclipsing the light flux with the mirrors.

Whereas a NA of no more than about 0.15 can be obtained in a four-mirror imaging-optical system, it is possible for a six-mirror optical system to have an even greater NA. Normally, an even number of mirrors is used in the imaging-optical system so that the mask stage and the substrate stage can be situated on opposite sides of the optical system. Since the imaging-optical system must correct aberrations using a limited number of surfaces, each of the mirrors typically has an aspherical profile, and a ring-field imaging scheme is used in which aberrations are corrected only in the proximity of a desired lateral displacement from the optical axis. To transfer the entire mask pattern onto the substrate, exposure is performed while scanning the mask stage and the substrate stage at respective velocities that differ from each other according to the magnification ratio of the imaging-optical system.

Imaging-optical systems, as discussed above, for use in SXR microlithography apparatus are so-called "diffraction-limited" optical systems. These optical systems cannot achieve the performance levels for which they were designed unless wavefront aberrations can be minimized adequately. A guideline for tolerances of wavefront aberration in a diffraction-limited optical system is Marechal's standard, in which the root-mean-square (RMS) departure of the wavefront from a reference sphere that is centered on the diffraction focus does not exceed $\lambda/14$, wherein $\lambda$ is wavelength. Born and Wolf, *Principles of Optics*, $7^{th}$ edition, Cambridge University Press, 1999, p. 528. These are the conditions for obtaining 80% or more of the Strehl intensity (the ratio of maximum point-image intensities in an optical system with aberrations to maximum point-image intensities in an optical system with no aberrations).

In the EUV microlithography techniques currently under vigorous research and development, exposure "light" is used having a wavelength primarily in the range of 13 nm to 11 nm. With respect to wavefront error (WFE) in an optical system, the form error (FE) allowed for each individual mirror is given by Equation (1):

$$FE = (WFE)/2/\sqrt{n}(RMS \text{ value}) \quad (1)$$

In Equation (1), "n" is the number of mirrors that make up the optical system, and WFE is divided by 2 because wavefront error is double the form error. This is because both incident light and reflected light in a reflective optical system are subject to the effects of each respective form error.

The form error (FE) allowed for each individual mirror in a diffraction-limited optical system is given by Equation (2), relative to wavelength λ and number of mirrors n:

$$FE = \lambda/28/\sqrt{n}(RMS \text{ value}) \quad (2)$$

In the case of a 4-mirror imaging-optical system, this value is 0.23 nm (RMS) at a wavelength of 13 nm and 0.20 nm (RMS) at a wavelength of 11 nm. In the case of an optical system comprising 6 mirrors, this value is 0.19 nm (RMS) at a wavelength of 13 nm and 0.16 nm (RMS) at a wavelength of 11 nm.

Unfortunately, a high-precision aspherical mirror satisfying the foregoing is extremely difficult to manufacture. This is the main reason why a practical SXR microlithography apparatus has not been realized yet. The fabrication accuracy achievable to date for an aspherical mirror is about 0.4 to 0.5 nm (RMS). Gwyn, *Extreme Ultraviolet Lithography White Paper*, EUV LLC, 1998, p. 17. Consequently, fabrication and design techniques for aspherical surfaces used in mirrors in imaging optical systems must be improved substantially in order to achieve a practical SXR microlithography apparatus that exhibits higher resolution than obtainable with current optical lithography.

SUMMARY OF THE INVENTION

In view of the shortcomings of the prior art as summarized above, an object of this invention is to provide SXR microlithography apparatus and methods that can achieve substantially improved resolution of pattern elements on a substrate than achievable using conventional SXR microlithography technology.

To such end, and according to a first aspect of the invention, microlithography apparatus are provided for forming an image, on a resist-coated substrate, of a pattern defined by a mask. An embodiment of such an apparatus comprises an illumination-optical system and an imaging-optical system (the latter also termed a "projection-optical system"). The illumination-optical system is situated and configured to direct an illumination light, having a wavelength within a range of 20 nm to 50 nm, from a source of the illumination light to a mask. The imaging-optical system comprises multiple reflective mirrors having at least one aspherical surficial profile. The imaging-optical system is situated and configured to direct an imaging light, propagating from the mask, to a substrate so as to achieve a pattern-element resolution of 71 nm or finer.

The apparatus can include an illumination-light source situated and configured to produce the illumination light and to direct the illumination light to the illumination-optical system. The illumination-light source can be any of the following: a laser-plasma X-ray source, a discharge-plasma light source, a synchrotron-radiation source, and an X-ray laser.

The mask typically is a reflective mask. With such a mask, the illumination-optical system is configured to direct the illumination light to the reflective mask, and the imaging-optical system is configured to receive the imaging light, formed by reflection of the illumination light from the mask, and to direct the imaging light to the substrate.

In a first example, the illumination light has a wavelength within a range of 20 nm to 22 nm. In such an instance, the imaging-optical system desirably has a numerical aperture of at least 0.15.

In a second example, the illumination light has a wavelength within a range of 20 nm to 36 nm. In such an instance, the imaging-optical system has a numerical aperture of at least 0.25.

In a third example, the illumination light has a wavelength within a range of 20 nm to 43 nm. In such an instance, the imaging-optical system has a numerical aperture of at least 0.3.

In a fourth example, the illumination light has a wavelength within a range of 20 nm to 50 nm. In such an instance, the imaging-optical system has a numerical aperture of at least 0.35.

The imaging-optical system can comprise multiple multilayer-film reflective mirrors each having, as a respective reflective surface, an aspherical surface coated with a respective multilayer film. The multilayer film comprises multiple sets of alternating layers of a first material having a refractive index that is as different as possible from the refractive index of a vacuum and of a second material having a refractive index that is as close as possible to the refractive index of a vacuum. The first material can be any of the following: boron, ruthenium, manganese, yttrium, zirconium, niobium, alloys of these elements, and compounds of these elements. The second material can be any of the following: lithium, magnesium, aluminum, alloys of these elements, and compounds of these elements.

Another embodiment of a microlithography apparatus includes an illumination-optical system situated and configured to direct an illumination light, having a wavelength within a range of 20 nm to 50 nm, from a source of the illumination light to a mask. The apparatus also includes an imaging-optical system having a numerical aperture of at least 0.15. In this embodiment, the imaging-optical system desirably comprises multiple multilayer-film reflective mirrors each having, as a respective reflective surface, an aspherical surface coated with a respective multilayer film. The multilayer film comprises multiple sets of alternating layers of a first material having a refractive index that is greatly different (as defined above) from the refractive index of a vacuum and of a second material having a refractive index that is slightly different (as defined above) from the refractive index of a vacuum. Specific examples of first and second materials are as summarized above. The apparatus can include an illumination-light source situated and configured to produce the illumination light and to direct the illumination light to the illumination-optical system. Specific examples of such illumination-light sources are as summarized above.

According to another aspect of the invention, multilayer-film reflective mirrors are provided for use in reflecting soft X-ray light. An embodiment of such a mirror comprises a mirror substrate including a reflective aspherical surface coated with a multilayer film. The multilayer film comprises multiple sets of alternating layers of a first material having a refractive index that is greatly different (as defined above) from the refractive index of a vacuum and of a second material having a refractive index that is slightly different (as defined above) from the refractive index of a vacuum. Each set consists of at least one layer of the first material and one layer of the second material. Example first and second materials are as summarized above. Desirably, the multilayer film comprises at least 20 sets of alternating layers (e.g., 20–40 sets).

By appropriately selecting the first and second materials and forming the multilayer films as summarized above, multilayer-film mirrors can be formed that reflect exposure light having a wavelength within a range of 20 nm to 50 nm with high reflectivity. By employing such mirrors in an imaging-optical system of a SXR microlithography apparatus, the required exposure time for wafers can be shortened using 20-nm to 50-nm soft X-rays.

According to another aspect of the invention, methods are provided for manufacturing a microelectronic device. In an embodiment of such a method, a soft X-ray beam (having a wavelength in the range of 20 nm to 50 nm) is directed to a mask defining a pattern. Soft X-ray light from the mask is projected onto a resist-coated wafer so as to form an image of the pattern on the wafer at a resolution of 71 nm or finer.

In another embodiment of a method for manufacturing a microelectronic device, a soft-X-ray beam (having a wavelength in the range of 20 nm to 50 nm) is directed to a mask defining a pattern. Soft X-ray light from the mask is passed through an imaging-optical system (having a numerical aperture of at least 0.15) onto a resist-coated wafer so as to form an image of the pattern on the wafer.

In yet another embodiment of a method for manufacturing a microelectronic device, an imaging-optical system is provided that is configured to project a soft X-ray beam, having a wavelength in a range of 20 nm to 50 nm and propagating from a pattern-defining mask, to form an image of the pattern on a substrate. The imaging-optical system is configured to have a numerical aperture of at least 0.15. After previously applying a patterned layer to a substrate, the substrate is polished. A layer of a resist then is applied to the polished substrate. A soft X-ray illumination beam is directed to the mask. Soft X-ray light from the mask is passed through the imaging-optical system onto the resist-coated substrate so as to form an image of the pattern on the substrate, wherein the image overlays the previously applied patterned layer on the substrate. This embodiment is especially useful in instances in which overlay exposure is being performed on a wafer in which circuit patterns have already been formed. By polishing and then exposing the already exposed wafer, the pattern defined by the mask can be transferred accurately to the wafer even if the depth of focus imaging-optical system is small.

The foregoing and additional features and advantages of the invention will be more readily apparent from the following detailed description, which proceeds with reference to the accompanying drawings.

DETAILED DESCRIPTION

The invention is described below in the context of representative embodiments, which are not intended to be limiting in any way.

First Representative Embodiment

Figure 1:
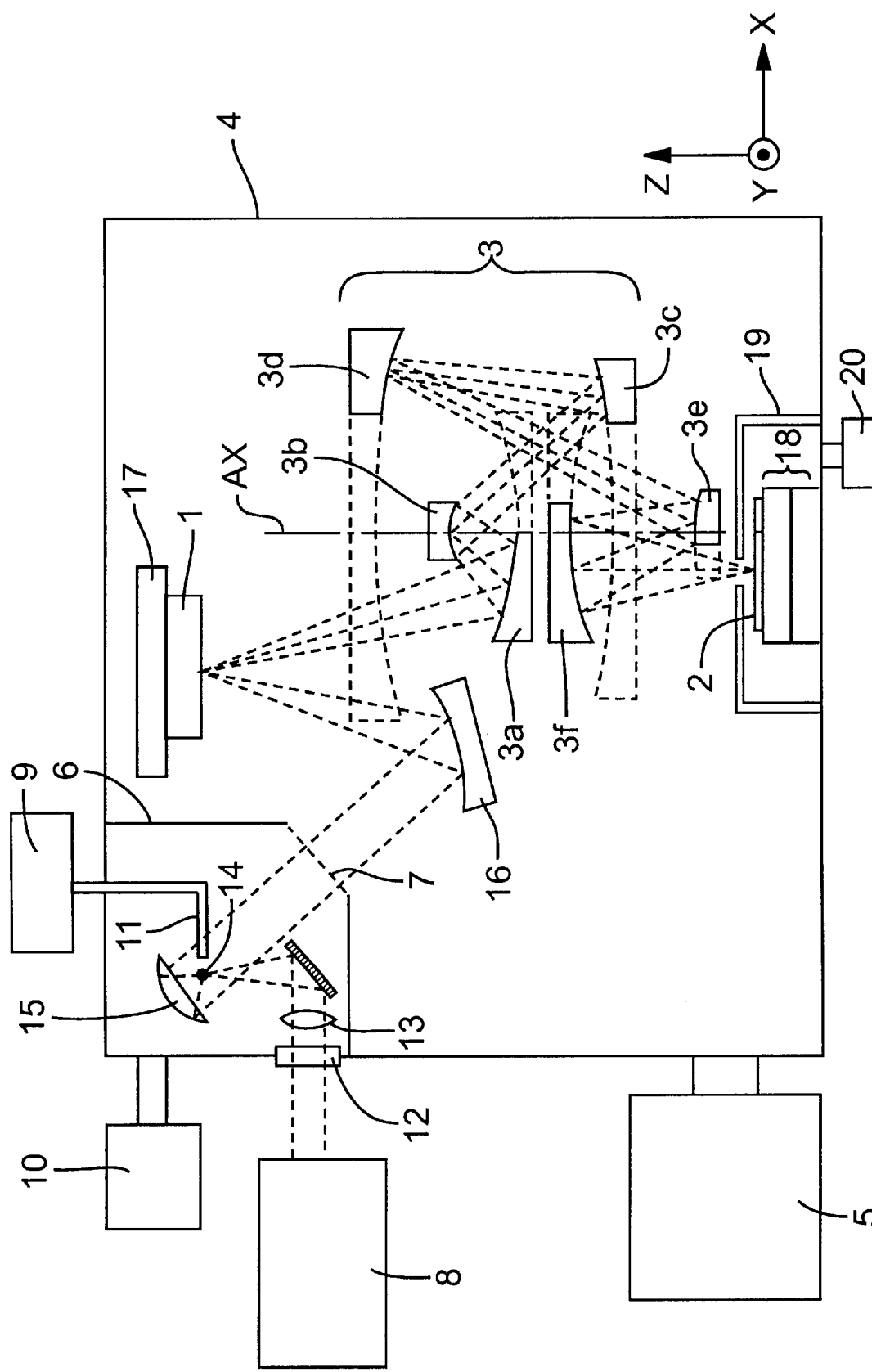
FIG. 1 is a schematic optical diagram of a microlithographic exposure apparatus according to a first representative embodiment of the invention, employing a laser-plasma soft X-ray "light" source.

A first representative embodiment is depicted schematically in FIG. 1. In this apparatus, a mask 1 is illuminated with soft X-ray (SXR) radiation (also termed EUV radiation). The pattern elements defined by the mask 1 are demagnified ("reduced") and projected onto a substrate 2 (e.g., semiconductor wafer) by an imaging-optical system 3. The imaging-optical system 3 comprises mirrors having at least one aspherical surficial profile. The imaging-optical system has the following characteristics to provide the system with an achievable resolution of about 70 nm or less, which cannot be achieved using current optical microlithography technology.

The resolution (Res) of the imaging-optical system 3 is expressed by Equation (3), which includes the wavelength ($\lambda$) used for exposure and the numerical aperture (NA) of the projection optical system 3:

$$Res=(k_1)\lambda/NA \tag{3}$$

wherein $k_1$ is an empirical coefficient that depends not only on the characteristics of the optical system, but also on the characteristics of the resist on the substrate. Achievable resolutions for various wavelengths and numerical apertures (NA), where $k_1$=0.5 are listed in Table 1.

TABLE 1

Resolutions at Wavelengths (λ) and Numerical Apertures (NA)

| NA/λ | 11 nm | 13 nm | 20 nm | 30 nm | 40 nm | 50 nm |
|---|---|---|---|---|---|---|
| 0.08 | 69 nm | 81 nm | 125 nm | 188 nm | 250 nm | 313 nm |
| 0.10 | 55 nm | 65 nm | 100 nm | 150 nm | 200 nm | 250 nm |
| 0.15 | 37 nm | 43 nm | 67 nm | 100 nm | 133 nm | 167 nm |
| 0.2 | 28 nm | 33 nm | 50 nm | 75 nm | 100 nm | 125 nm |
| 0.25 | 22 nm | 26 nm | 40 nm | 60 nm | 80 nm | 100 nm |
| 0.3 | 18 nm | 27 nm | 33 nm | 50 nm | 67 nm | 133 nm |
| 0.35 | 16 nm | 19 nm | 229 nm | 43 nm | 57 nm | 71 nm |
| 0.4 | 14 nm | 16 nm | 25 nm | 38 nm | 50 nm | 63 nm |
| 0.45 | 12 nm | 14 nm | 22 nm | 33 nm | 44 nm | 56 nm |
| 0.5 | 11 nm | 13 nm | 20 nm | 30 nm | 40 nm | 50 nm |

From Table 1, it can be seen that, whenever an imaging-optical system having a numerical aperture (NA) of 0.08 is used at a wavelength of 11 nm, the achieved resolution is 69 nm. Also, whenever, an imaging-optical system having a NA of 0.10 is used at a wavelength of 13 nm, the achieved resolution is 65 nm. However, to achieve these performance levels, even in an imaging-optical system 3 comprising six aspherical mirrors, such as that shown in FIG. 1, it is necessary to manufacture each of the individual mirrors of the imaging-optical system 3 with a form accuracy of no more than about 0.2 nm (RMS).

Hence, this embodiment is configured especially for use with soft X-rays having a wavelength range of 20 nm to 50 nm. By way of examples, if the wavelength of the soft X-rays is 20 nm, then the obtained resolution is 67 nm with an imaging-optical system 3 having a numerical aperture of 0.15. Similarly, at a wavelength of 30 nm, the obtained resolution is 60 nm with an imaging-optical system having a numerical aperture of 0.25. At a wavelength of 40 nm, the obtained resolution is 67 nm with an imaging-optical system having a numerical aperture of 0.3. At a wavelength of 50 nm, the obtained resolution is 71 nm with an imaging-optical system having a numerical aperture of 0.35.

Exemplary form accuracies of the various mirrors that make up the imaging-optical system 3 are as listed in Table 2. Table 2 lists RMS tolerance for form error of the mirrors, calculated using Equation (2), above.

TABLE 2

Form Error (FE) Tolerances and Wavefront Error (WFE) Tolerances at Various Wavelengths

|  | 11 nm | 13 nm | 20 nm | 30 nm | 40 nm | 50 nm |
|---|---|---|---|---|---|---|
| WFE Tolerance | 0.79 nm | 0.93 nm | 1.43 nm | 2.14 nm | 2.86 nm | 3.57 nm |
| FE Tolerance (4-mirror system) | 0.20 nm | 0.23 nm | 0.36 nm | 0.53 nm | 0.71 nm | 0.89 nm |
| FE Tolerance (6-mirror system) | 0.16 nm | 0.19 nm | 0.29 nm | 0.44 nm | 0.58 nm | 0.73 nm |

As evident from Table 2, using soft X-rays with wavelengths in the range of 20 nm to 50 nm substantially relaxes the form-error requirements for the mirrors constituting the imaging-optical system, compared to use of soft X-rays in a wavelength range of 11 to 14 nm conventionally used for SXR microlithography. For example, in a 6-mirror system, it is possible to achieve form tolerances of 0.4 to 0.5 nm (RMS) (the currently required level for aspherical surfaces) using wavelengths of 50 nm to 30 nm. At a wavelength of 20 nm, the form precision of mirrors used in the imaging-optical system including six mirrors is eased by about 25 percent from the form precision required in mirrors used in a 4-mirror imaging-optical system at a wavelength of 13 nm. Additionally, the form precision of mirrors used in an imaging-optical system made from four mirrors is further eased by approximately 50 percent, making them much easier to manufacture than mirrors used in an imaging-optical system for use in the 11 to 14 nm wavelength band.

Since mirror fabrication thus can be accomplished at a form precision within a reliably practicable range, the manufacturing yield of acceptable mirrors can be vastly improved for aspherical mirrors as used in imaging-optical systems.

Figure 5A:
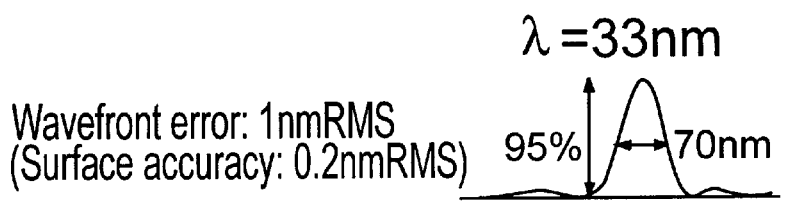
FIGS. 5(a)–5(d) are plots depicting differences in imaging, according to the exposure wavelength and the wavefront error of the optical system.
Figure 5B:
Figure 5C:
Figure 5D:

FIGS. 5(a)–5(d) provide comparisons of images obtained at wavelengths of 33 nm (FIGS. 5(a) and 5(c)) and 13 nm (FIGS. 5(b) and 5(d)) using an imaging-optical system made from six mirrors and having a numerical aperture of 0.25. FIG. 5(a) is a plot of Strehl intensity of a 70-nm linewidth image at a wavelength of 33 nm at a wavefront error of 1 nm (RMS). (The form precision of each mirror was 0.2 nm (RMS)). From FIG. 5(a), it can be seen that resolution can be achieved at 95 percent Strehl intensity. FIG. 5(b) is a plot of the Strehl intensity of a 30-nm linewidth image at a wavelength of 13 nm. Even under such conditions, resolution can be achieved at 80-percent Strehl intensity.

Hence, if the form precision of the various mirrors is improved so as to minimize wavefront error sufficiently, imaging is possible for a pattern having a linewidth of 71 nm or less. However, fabrication is impossible at form precisions of approximately 0.2 nm (RMS).

Mirrors having a form precision of 0.5 nm (RMS) can be manufactured readily. Assuming that the numerical apertures and number of mirrors used are the same, the wavefront error at this form precision would be 2.5 nm (RMS). Even if one attempted to use such an imaging-optical system to form an image of a pattern having a linewidth of 70 nm using 13-nm wavelength soft X-rays, resolution would be completely impossible. The Strehl intensity of such an image is shown in FIG. 5(d).

In view of the foregoing, it now is possible to resolve 70-nm-linewidth images using soft X-rays having a wavelength of 20 to 50 nm, even without improving the form precision of the mirrors of the imaging-optical system. As an example, the Strehl intensity of a 70-nm-linewidth image, at a wavelength of 33 nm is as shown in FIG. 5(c). According to FIG. 5(c), resolution can be achieved at 80 percent Strehl intensity.

By using soft X-rays in the wavelength range of 20 to 50 nm, as discussed above, microlithography apparatus can be realized that achieve sufficiently high resolution to form images of pattern linewidths of about 71 nm and smaller. This performance is achieved with an imaging-optical system including aspherical-surface mirrors having currently practicable fabrication precision (0.4 to 0.5 nm (RMS)).

A microlithography apparatus according to this embodiment is configured according to these performance levels, and shown in FIG. 1. The apparatus is a "projection-exposure" apparatus that performs exposure of a mask pattern by "step-and-scan." Illumination of a reflective mask 1 is performed using soft X-rays having a wavelength of about 30 nm. In FIG. 1, the Z-direction is the optical-axis direction, the X-direction is perpendicular to the Z-direction and extends across the plane of the page, and the Y-direction is perpendicular to both the X-direction and the Z-direction and extends perpendicularly to the plane of the page.

The FIG. 1 apparatus comprises a vacuum chamber 4 enclosing an imaging-optical system 3, a mask stage 17 (for holding the reflective mask 1), and a substrate stage 18 (for holding a substrate, e.g., a wafer 2). A separate vacuum subchamber 6 encloses the "light source" (described below) used to illuminate the mask 1. The vacuum chamber 4 is required because soft X-rays, used as the illumination "light," has a low transmissivity in air. Consequently, the light path through which the soft X-rays pass is contained in the vacuum chamber 4 and thus shielded from the atmosphere. The vacuum chamber 4 is evacuated by a vacuum pump system 5.

During an exposure made using the FIG. 1 apparatus, the mask stage 17 (holding the mask 1) and the substrate stage 18 (holding the wafer 2) are scanned at respective velocities in a linear direction (here, the X-direction) relative to the imaging-optical system 3. Meanwhile, SXR light reflected from illuminated portions of the mask 1 propagates through the imaging-optical system 3, which projects respective images of the illuminated portions onto the wafer 2. I.e., the reflective mask 1 is used as a projection pattern master for producing corresponding images on the wafer 2. The apparatus employs a step-and-scan scheme to transfer the entire circuit pattern, as defined on the reflective mask 1, to multiple respective "shot fields" on the wafer 2.

The source of SXR "light" in this embodiment is a laser-plasma light source that utilizes a target material for producing soft X-rays. By way of example, the target material can be a gas delivered from a gas supply 9 and discharged from a nozzle 11 as a gas jet into the vacuum subchamber 6. Meanwhile, a laser light source 8 produces pulses of laser light having a wavelength in the infrared to ultraviolet range. By way of example, the laser light source 8 can be a YAG laser or excimer laser. Pulsatile laser light from the laser light source 8 is directed into the vacuum subchamber 6 through a laser-entry window 12. The laser light is focused by a lens 13 onto the target material (e.g., jet of gas) discharged from the nozzle 11. Illumination of the target material by the pulses of laser light results in absorption of the laser light by the target material, with consequent heating of the target material sufficiently to ionize molecules of the target material and form a plasma 14. Excited target-material ions in the plasma tend to shift toward a lower potential state, and the excess energy is liberated from the transition as soft X-rays. So long as the light source produces soft X-rays from a plasma formed in such a manner, the target material is not limited to being in a gaseous state. Alternatively, for example, the target material can be a liquid or suspension of fine particles, or the like. In other words, any of various target materials can be used, so long as the target material generates, when irradiated by a laser, SXR light having a wavelength of 30 nm for use in this embodiment.

The vacuum subchamber 6 includes a window 7 to allow escape of a beam of SXR radiation. The vacuum subchamber 6 is desirable because the tip of the nozzle 11, from which the target material is discharged, tends to produce debris (e.g., flying dust) that is cast off by the plasma. To avoid contaminating the vacuum chamber 4 with such dust, it is desirable that the light source be enclosed within the vacuum subchamber 6 that is separate from the vacuum chamber 4 and equipped with a separate vacuum pump system 10.

The optical components (e.g., item 15) situated inside the vacuum subchamber 6 constitute a portion of the "illumination-optical system" of the FIG. 1 configuration. The illumination-optical system includes a parabolic mirror 15 situated so as to surround the plasma 14 partially, wherein the focal point of the parabolic mirror 15 is located within the plasma. The parabolic mirror 15 includes a multilayer reflective film that reflects soft X-rays. The reflected soft X-rays pass through the window 7 in the vacuum subchamber 6 and propagate toward a multilayer-film mirror 16 that also constitutes a portion of the illumination-optical system. The window 7, desirably made of an aluminum thin film, not only performs the function of vacuum isolation, but also serves as a filter that blocks transmission of extraneous wavelengths.

Soft X-rays reflected and focused by the multilayer-film mirror 16 are incident on the reflective mask 1 so as to illuminate a specified illumination field on the reflective mask 1. Even though only one multilayer-film mirror 16 is illustrated in FIG. 1, it will be understood that multiple such mirrors can be employed in the illumination-optical system between the parabolic mirror 15 and the mask 1 to appropriately direct illumination SXR light to the mask 1. In the FIG. 1 configuration, the reflective mask 1 is illuminated by critical illumination. However, it will be understood that illumination of the mask alternatively can be by Koehler illumination or Koehler critical illumination.

A flux of SXR light reflected from the mask 1, and containing pattern information from the illuminated region of the mask 1, enters the imaging-optical system 3 (also termed a "projection-optical system"). In the FIG. 1 configuration, the imaging-optical system 3 comprises a concave first mirror 3a, a convex second mirror 3b, a concave third mirror 3c, a concave fourth mirror 3d, a convex fifth mirror 3e, and a concave sixth mirror 3f (a total of six mirrors). Some or all of these mirrors 3a–3f have an aspherical reflective surface profile. Each reflective surface comprises a multilayer film that reflects SXR radiation. The mirrors 3a–3f are disposed coaxially on a central axis AX. The numerical aperture of the imaging-optical system 3 in FIG. 1 is 0.25. The imaging-optical system 3 can be as described in U.S. Pat. No. 5,815,310.

The first mirror 3a, third mirror 3c, fourth mirror 3d, fifth mirror 3e, and sixth mirror 3f are provided with respective cut-outs so as not to block the return light paths created by the various mirrors 3a–3f. The cutouts are shown in FIG. 1 by broken lines. In addition, an aperture (not shown) is disposed at the position of the second mirror 3b.

Soft X-rays reflected by the mask 1 are reflected sequentially by the mirrors 3a–3f to form a "reduced" (demagnified) image of the illuminated portion of the mask 1 within a respective region in an exposure field on the wafer 2. Image demagnification is based on a specified "demagnification ratio" $\beta$ (e.g., $|\beta|=¼, ⅕, ⅙$). The imaging-optical system 3 is constructed so as to be telecentric on the image side (i.e., the wafer side).

For microlithographic exposure, the reflective mask 1 is mounted to and supported by the mask stage 17 that is movable along at least the X-direction. The substrate (wafer) 2 is mounted to and supported by the substrate stage 18 that is movable along the XYZ directions. During exposure, while an illumination field on the mask 1 is being irradiated with soft X-rays directed to the mask by the illumination-optical system, the mask 1 and wafer 2 are moved at a specified velocity ratio relative to the imaging-optical system 3. The velocity ratio is a function of the demagnification ratio of the imaging-optical system. Thus, the pattern defined on the mask 1 is exposed and transferred to a specified shot field on the wafer 2.

In this embodiment, by utilizing soft X-rays having a wavelength of 30 nm and by configuring the imaging-optical system with a numerical aperture of at least 0.25, the mirrors 3a–3f of the imaging-optical system 3 can be manufactured with a form error of no more than 0.45 nm (RMS), thereby providing a resolution of 71 nm or less. With such an imaging-optical system 3, the wavefront error is less than 2.2 nm (RMS). At a numerical aperture of 0.25, resolution of 71 nm can be obtained at a wavelength of less than 36 nm. Even finer resolution can be obtained if the imaging-optical system 3 is configured with a numerical aperture of greater than 0.25.

The FIG. 1 apparatus includes a partition 19 within which the substrate 2 and substrate stage 18 are situated. The partition 19 keeps the substrate in a space separate from the remainder of the space within the vacuum chamber 4 to prevent gaseous material, released from the resist on the wafer 2 during exposure, from depositing on and adversely affecting the mirrors 3a–3f. The space within the partition 19 is evacuated using a separate vacuum pump 20 that removes the gaseous material. Otherwise, the gaseous material could adsorb onto the surfaces of the reflective mirrors 3a–3f and the mask 1 and cause deterioration of the respective optical properties of these components.

Each of the parabolic mirror 15, the multilayer-film mirror 16, the reflective mask 1, and the various mirrors constituting the imaging-optical system 3 is constructed with a respective support substrate. The support substrates are made of glass or other suitable material (e.g., Invar) having a low coefficient of thermal expansion. Each support substrate has a surface having a respective surficial profile suitable for use as a reflective mirror. Each such surface includes a multilayer film made from alternating layers of at least two materials having different refractive indices.

Figure 6:
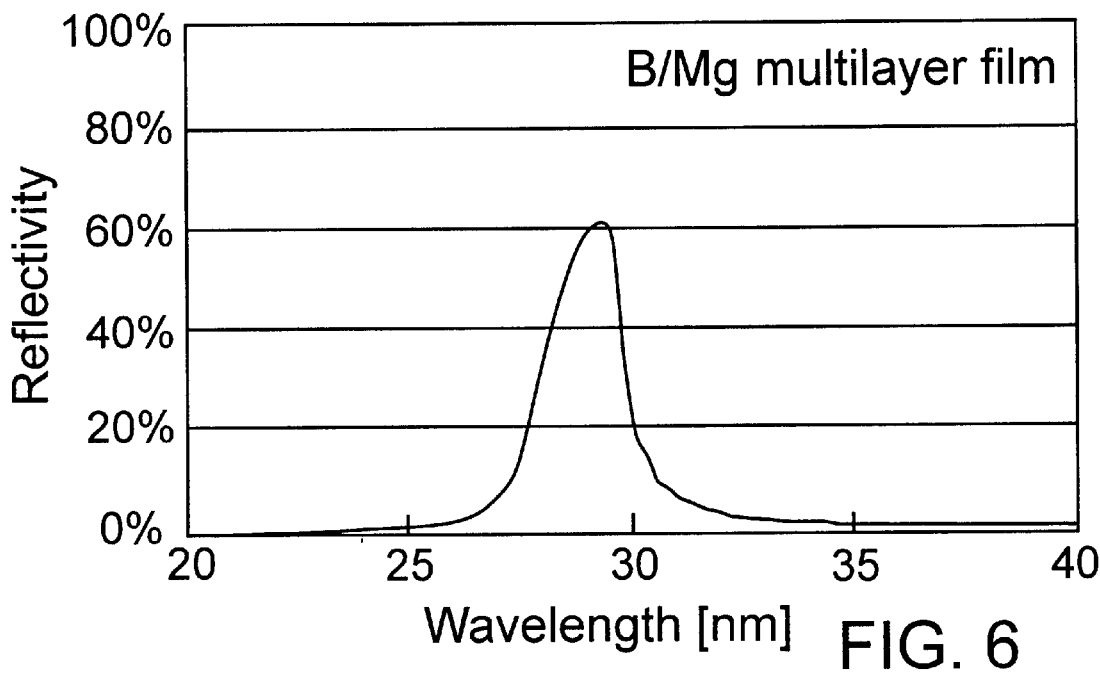
FIG. 6 is a graph of reflective properties of a B/Mg multilayer-film reflective mirror at wavelength of 20 to 40 nm.

Specifically, in order to reflect soft X-rays (with a wavelength of about 30 nm) with high efficiency, the reflective surface of each support substrate is coated with alternating layers of boron (a material having a refractive index that is as different as possible from that of a vacuum) and magnesium (a material havin a refractive index that is as close as possible to that of the vacuum). Desirably, the multilayer film comprises 30 lamina sets each consisting of a 4.5-nm-thick boron layer and a 10-nm-thick magnesium layer. The lamina sets are arranges such that the layers are in alternating order. A plot of calculated values of the reflective properties of a mirror having such a multilayer film is shown in FIG. 6. The peak reflectivity is approximately 62% and the half-widths is approximately 2.0 nm.

Besides boron, ruthenium (Ru), manganese (Mn), yttrium (Y), zirconium (Zr), niobium (Nb), as well as alloys of and compounds containing these elements, can be used to make the high-refractive-index layers. Besides magnesium, lithium (Li), aluminum (Al), as well as alloys of and compounds containing these elements, can be used to make the low-refractive index layers.

Figure 7:
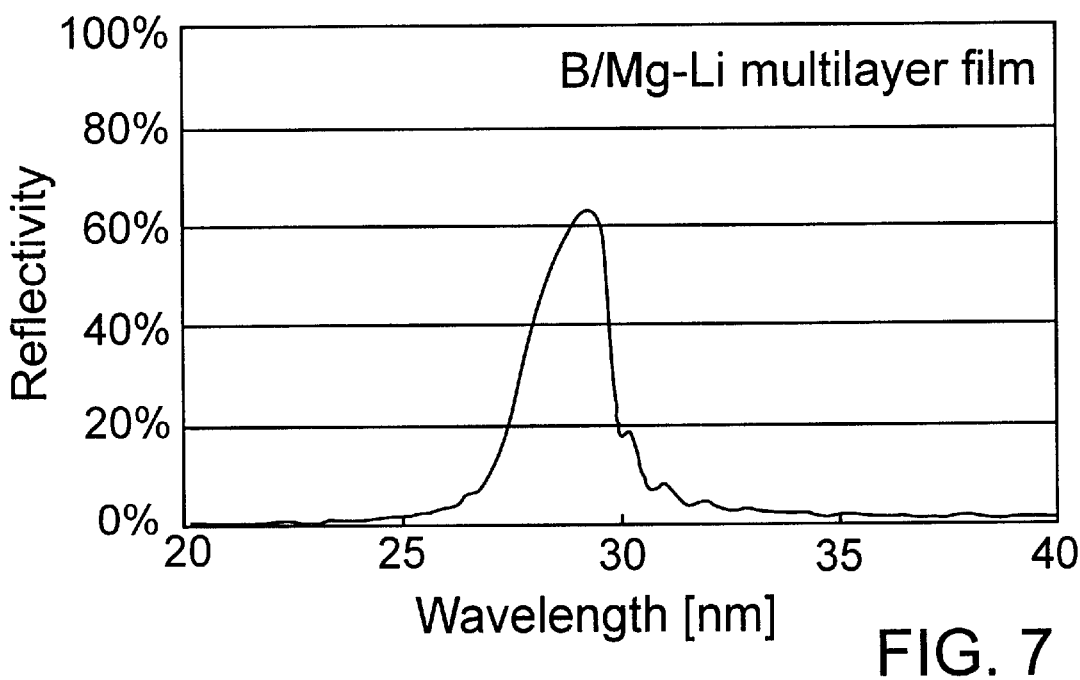
FIG. 7 is a graph of reflective properties of a B/Mg-Li multilayer-film reflective mirror at a wavelength of 20 to 40 nm.

Further alternatively, the mirrors can have a reflective surface made from multiple alternating layers of boron (as the high-refractive-index material) and a Mg—Li alloy (as the low-refractive-index layer material). A plot of calculated values of the reflective properties of a mirror having such a multilayer film is shown in FIG. 7. The multilayer film on the mirror used to produce the data of FIG. 7 has 30 lamina sets each including a 5-nm-thick boron layer and a 10-nm-thick Mg—Li alloy layer. The lamina sets are arranged such that the layers are in alternating order. A specific Mg—Li alloy is a material called LA141 A (ASTM) that contains 13 to 15% (w/w) lithium. In calculations, boron/lithium multilayer films yield the highest reflectivity. But, since lithium-is an--extremely-reactive material it is difficult to maintain the periodic structure of the multilayer film over long periods. A multilayer film with substantially greater stability can be manufactured by using the Mg—Li alloy instead of lithium alone.

Figure 8:
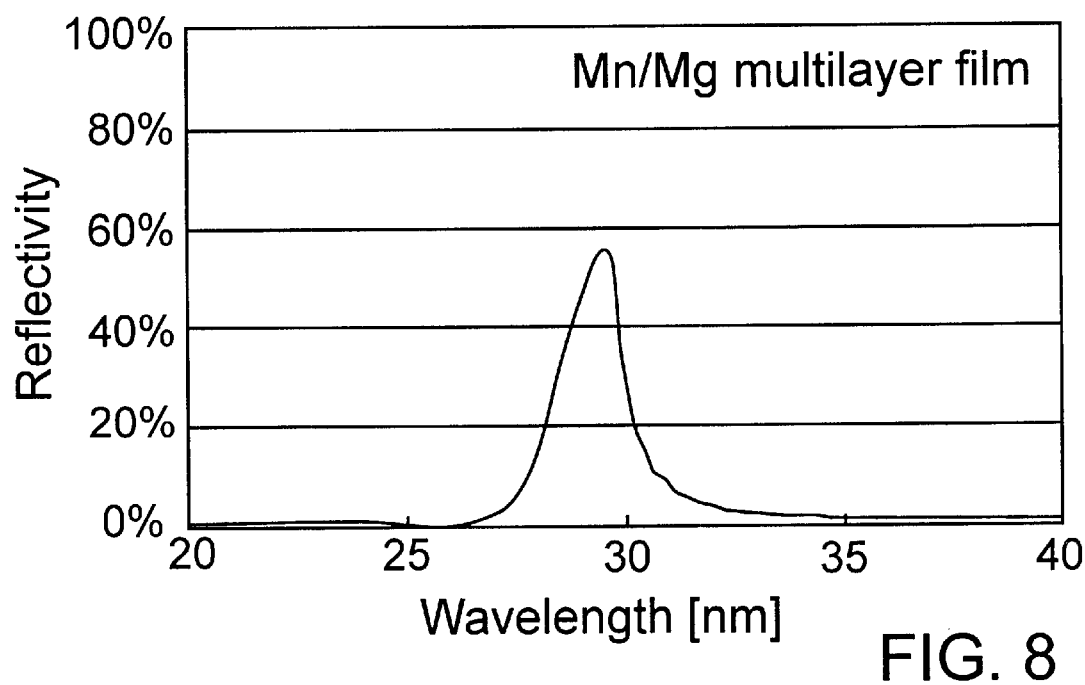
FIG. 8 is a graph of reflective properties of a Mn/Mg multilayer-film reflective mirror at a wavelength range of 20 to 40 nm.

A plot of calculated values of the reflective properties of a multilayer film in which manganese is used as the material for the high-refractive-index layer and magnesium is used as the material for the low-refractive-index layer is shown in FIG. 8. The multilayer film on the mirror used to produce the data of FIG. 8 has 30 lamina sets each including a 3.5-nm-thick manganese layer and a 11.5-nm-thick magnesium layer. The lamina sets are arranged such that the layers are in alternating order. The peak reflectivity of such an arrangement is approximately 56%, with a half-width of approximately 1.6 nm.

Figure 9:
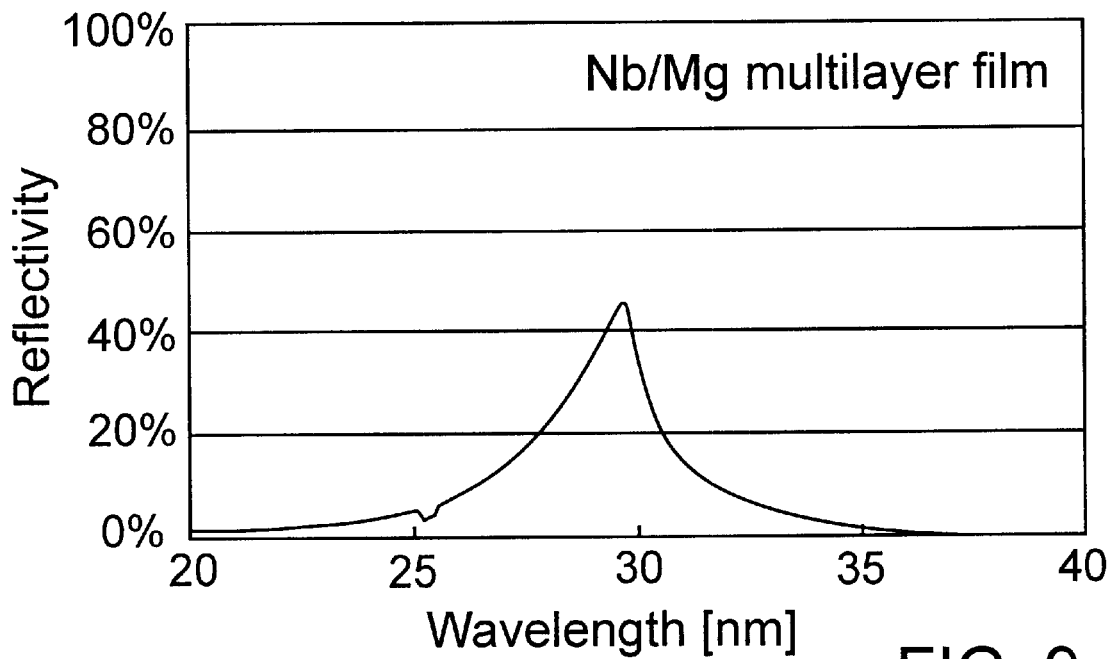
FIG. 9 is a graph of reflective properties of a Nb/Mg multilayer-film reflective mirror at a wavelength range of 20 to 40 nm.

A plot of calculated values of the reflective properties of a multilayer film in which niobium is used as the material for the high-refractive-index layer and magnesium is used as the material for the low-refractive-index layer is shown in FIG. 9. The multilayer film on the mirror used to produce the data of FIG. 9 has 30 lamina sets each including a 3-nm-thick niobium layer and a 12-nm-thick magnesium layer. The lamina sets are arranged such that the layers are in alternating order. The peak reflectivity of such an arrangement is approximately 45%, with a half-width of approximately 2.4 nm.

Figure 10:
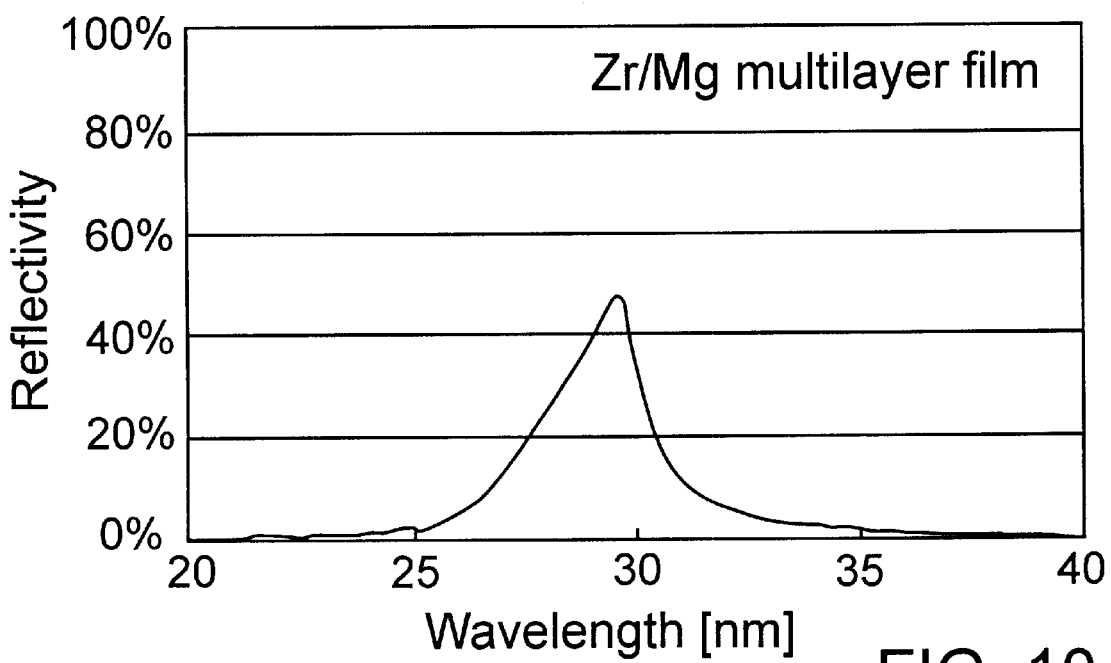
FIG. 10 is a graph of reflective properties of a Zr/Mg multilayer-film reflective mirror at a wavelength range of 20 to 40 mn.

With a wavelength of 30 nm (+/−5 nm), multilayer films also may be formed on support substrates using zirconium as the material for the high-refractive-index layer and using magnesium as the low-refractive-index layer. A plot of calculated values of the reflective properties of such a multilayer film is shown in FIG. 10. The multilayer film on the mirror used to produce the data of FIG. 10 has 30 lamina sets each including a 3-nm-thick zirconium layer and a 12-nm-thick magnesium layer. The lamina sets are arranged such that the layers are in alternating order. The peak reflectivity of such an arrangement is approximately 46%, with a half-width of approximately 2.3 nm.

Figure 11:
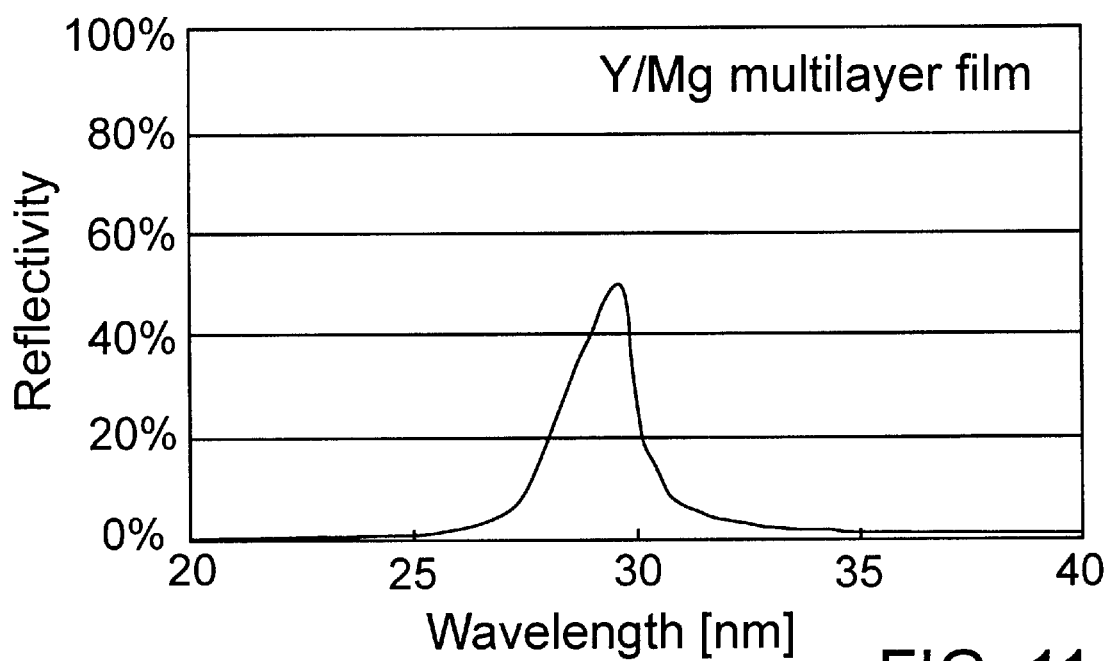
FIG. 11 is a graph of reflective properties of a Y/Mg multilayer-film reflective mirror at a wavelength range of 20 to 40 nm.

Multilayer films also may be formed on support substrates using yttrium as the material for the high-refractive-index layer and using magnesium as the low-refractive-index layer. A plot of calculated values of the reflective properties of such a multilayer film is shown in FIG. 11. The multilayer film on the mirror used to produce the data of FIG. 11 has 30 lamina sets each including a 3-nm-thick yttrium layer and a 12-nm-thick magnesium layer. The lamina sets are arranged such that the layers are in alternating order. The peak reflectivity of such an arrangement is approximately 50%, with a half-width of approximately 1.8 nm.

Hence, the reflectivity of each of the various mirrors used in the FIG. 1 embodiment can be altered (and improved) by forming multilayer films made from alternating layers of various materials on an aspherical support substrate. With such a configuration, wafer-exposure times can be shortened and processing capacity can be increased. Desirably, the materials used to form the multilayer films are selected to have optimal reflection spectra according to the spectrum of SXR "light" produced by the illumination-light source or other suitable light source.

More than two materials can be used to form the multilayer film. For example, layers can be formed of two, three, or even four different types of materials. When forming a multilayer film using three types of materials, the materials desirably are selected so that the refractive indices (at the wavelength being used) of two of the three substances are nearly equal and the remaining material has a refractive index that is different from the refractive indices of the other two materials. (In the wavelength region of EUV, refractive index can be expressed by the complex number $n=1-\delta-ik$, wherein ik is the absorption ratio. A variation of δ of no more than 50% is encompassed by "nearly equal", and a variation of more than 50% is encompassed by "different".) By sequentially laminating layers of these materials in an alternating manner, three types of layers actually are laminated together, but the resulting multilayer-film mirror is optically identical to a mirror of which the reflective surface is formed of layers of only two types of materials (one with a high refractive index and the other with a low refractive index, as defined above). The mirror can be constructed with either the high-refractive index layer or the low-refractive index layer having the two-layer structure, and the film thickness per layer can be made thinner. Since film stress is reduced by reducing the thicknesses of the films, deformation of the support substrate can be kept to a minimum after the alternating multilayer film has been formed.

Second Representative Embodiment

Figure 2:
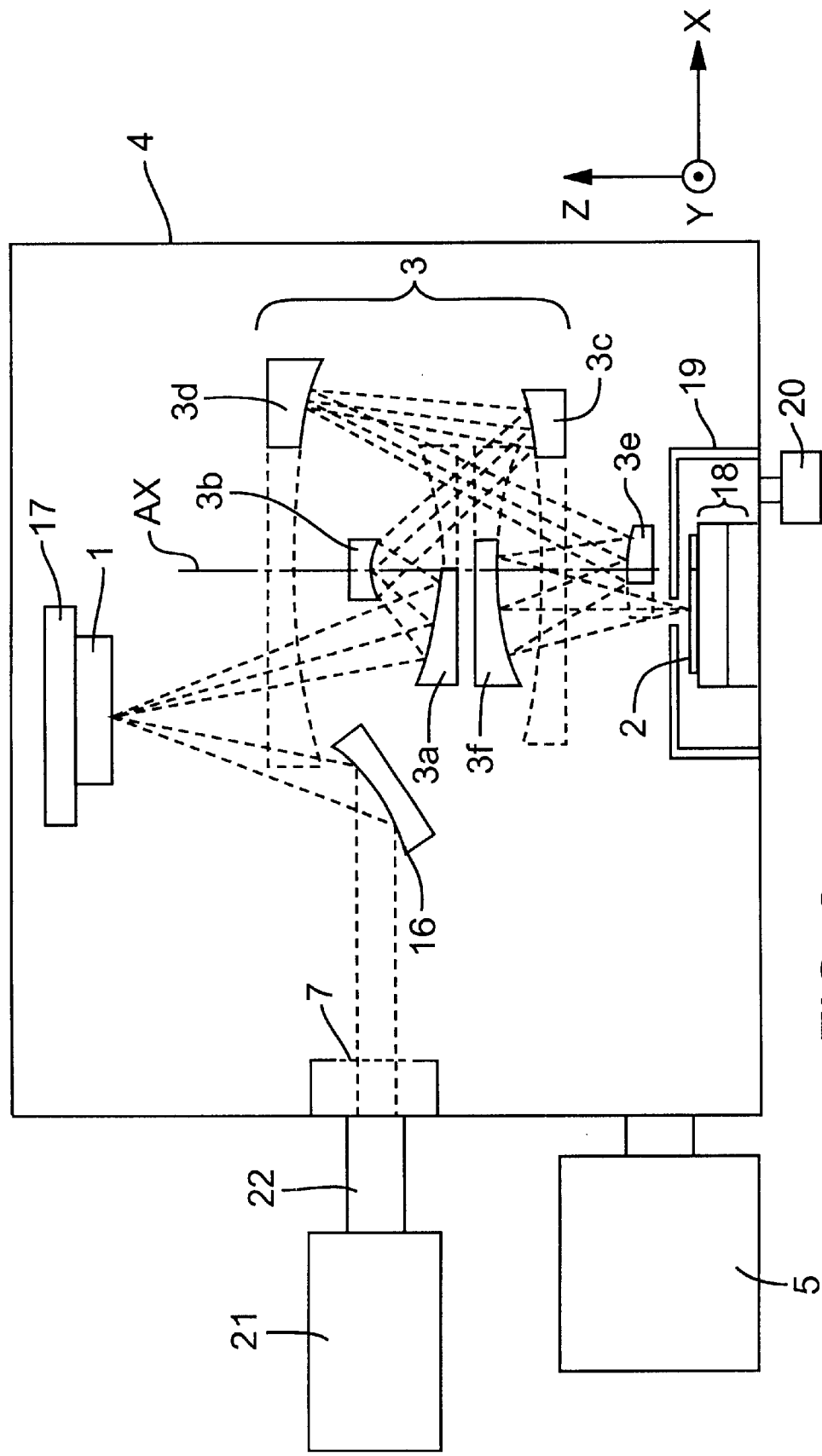
FIG. 2 is a schematic optical diagram of a microlithographic exposure apparatus according to a second representative embodiment, employing an undulator source of soft X-rays.

A second representative embodiment is depicted in FIG. 2, in which components that are the same as shown in FIG. 1 have the same respective reference numerals and are not described further. The embodiment of FIG. 2 is a step-and-scan system that utilizes SXR radiation having a wavelength of 20 nm as an illumination "light" for exposure.

The illumination SXR light in this embodiment is produced by an undulator source 21, which is a type of synchrotron radiation source. The output of the undulator source 21 is routed to the vacuum chamber 4 by a vacuum conduit 22. The vacuum conduit 22 is connected to the vacuum chamber 4 via a window 7. The interior of the undulator source 21 must be maintained at an ultra-high vacuum of about $10^{-10}$ Torr, whereas a vacuum of up to about $10^{-5}$ Torr inside the vacuum chamber 4 will absorb insignificant amounts of SXR radiation. Hence, the need for the window 7 that provides a vacuum seal but transmits SXR radiation from the undulator source 21. Soft X-rays passing through the window 7 are reflected by the multilayer-film mirror 16 to the reflective mask 1, as in the first representative embodiment. A flux of SXR radiation, reflected by the reflective mask 1 and containing information concerning the illuminated region of the mask 1, propagates to the imaging-optical system 3.

Except for their respective numerical apertures, the imaging-optical system 3 of the FIG. 2 embodiment is configured identically to the imaging-optical system 3 of the FIG. 1 embodiment. The numerical aperture of the FIG. 2 embodiment is set to 0.2 by an appropriate adjustment of an aperture (not shown) disposed at the position of the second mirror 3b. To enable the mirrors 3a–3f to achieve an image resolution of 71 nm or less, they desirably are manufactured such that the wavefront error of the imaging-optical system 3 is less than 1.5 nm (RMS). This provides a sufficiently high-resolution microlithographic exposure apparatus even though the magnitude of the form error is not very small.

If the numerical aperture is set to 0.15, then an image resolution of 71 nm can be obtained at wavelengths even shorter than 22 nm. Even finer resolutions can be obtained by setting the numerical aperture even larger.

Figure 12:
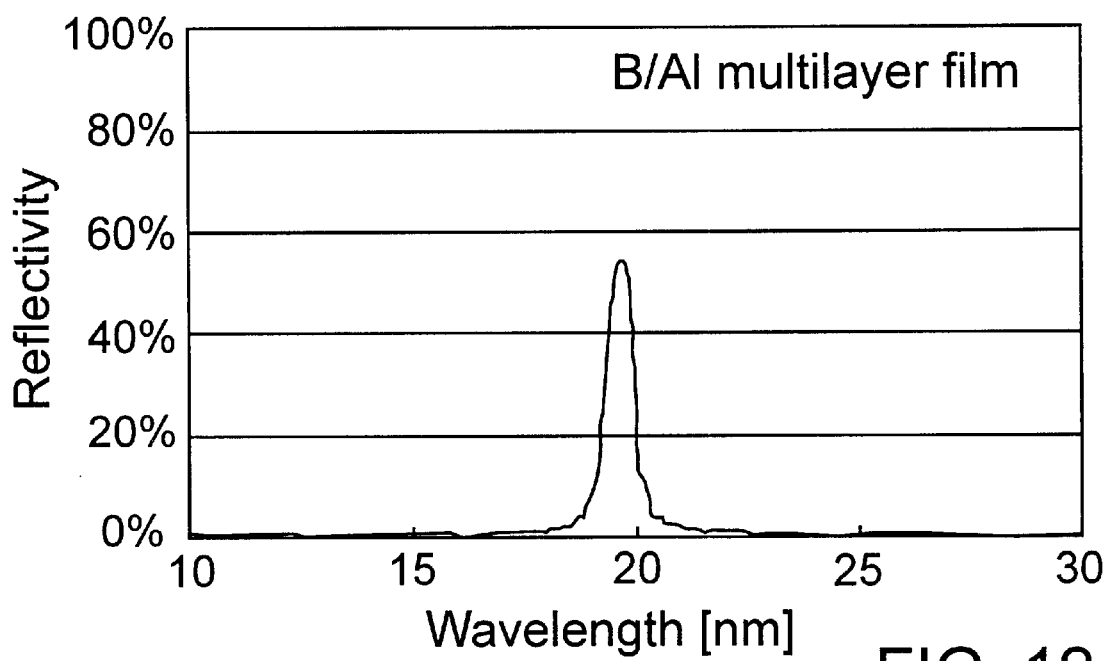
FIG. 12 is a graph of reflective properties of a B/Al multilayer-film reflective mirror at a wavelength range of 10 to 30 nm.

The parabolic mirror 16, the reflective mask 1, and the various mirrors constituting the imaging-optical system 3 are coated with alternating multilayer films of boron (B) as the high-refractive-index material and aluminum (Al) as the low-refractive-index material. These mirrors are effective for reflecting soft X-rays having wavelengths of about 20 nm. Desirably, the multilayer film consists of 40 lamina sets each including a 3-nm-thick boron layer and a 7-nm-thick aluminum layer. The lamina sets are arranged such that the layers are in alternating order. A plot of calculated values of the reflective properties of such a multilayer film is shown in FIG. 12, in which the peak reflectivity is approximately 52%, and the half-width is approximately 0.8 nm.

Besides boron, any of ruthenium (Ru), manganese (Mn), yttrium (Y), zirconium (Zr), niobium (Nb), alloys of these elements, and compounds containing these elements can be used as the high-refractive-index material. Besides magnesium, any of lithium (Li), aluminum (Al), alloys of these elements, and compounds containing these elements can be used as the low-refractive-index material.

Third Representative Embodiment

Figure 3:
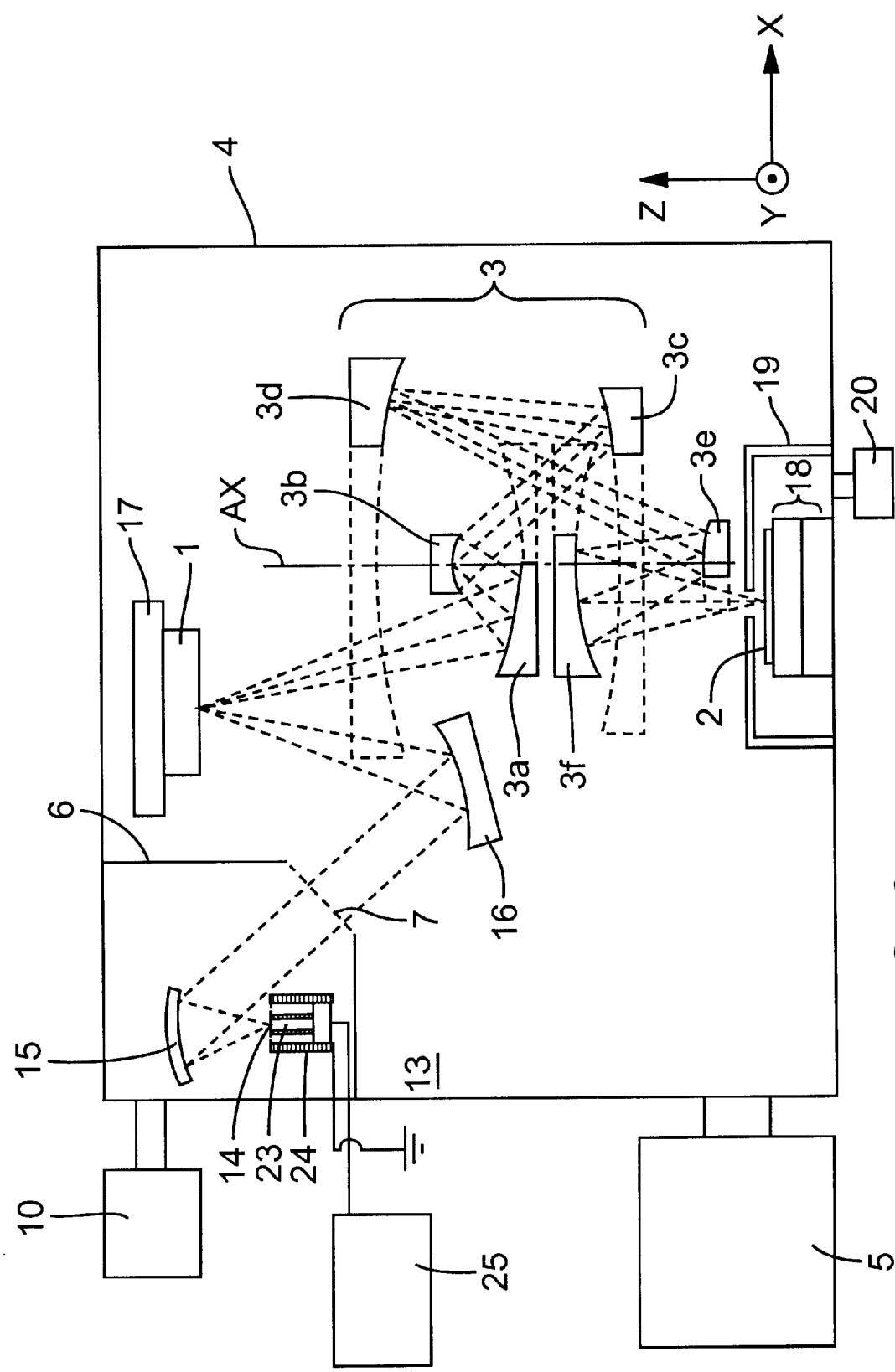
FIG. 3 is a schematic optical diagram of a microlithographic exposure apparatus according to a third representative embodiment, employing a plasma-focusing soft X-ray source.

A third representative embodiment is depicted in FIG. 3, in which components that are the same as shown in FIG. 1 have the same respective reference numerals and are not described further. The embodiment of FIG. 3 is a step-and-scan system that utilizes SXR radiation having a wavelength of 40 nm as an illumination "light" for exposure.

The illumination SXR light is produced a plasma-focusing light source, as described in U.S. Pat. No. 5,763,930. The plasma-focusing light source is constructed from a central tungsten (W) hollow-pipe electrode (anode) 23 surrounded by a cylindrical electrode (cathode) 24. The anode is connected to a high-voltage pulse power supply 25 and the cathode 24 is grounded. Xenon (Xe) is introduced into the vacuum subchamber 6 as a buffer gas. Whenever a pulsed voltage is impressed between the anode 23 and the cathode 24, a plasma 14 is pinched at the tip of the anode 23, thereby increasing the temperature of the plasma to a temperature needed to emit soft X-rays. Specifically, as ions of the buffer gas that have been excited in the plasma shift toward a lower-potential baseline state, excess energy is emitted from the ions as soft X-rays.

The plasma-focusing light source must be situated in the vacuum subchamber 6 (separate from the vacuum chamber 4) that is evacuated separately (by the vacuum pump system 10) because the tip of the anode 23 produces particulate material (dust) that is cast off by the plasma.

The parabolic mirror 15, comprising part of the illumination-optical system, is situated so as to surround the plasma 14. The parabolic mirror 15 is positioned so that its focal point is nearly matched to the location of the plasma. The inner surface of the parabolic mirror 15 is coated with a multilayer film to reflect the soft X-rays. The reflected SXR radiation passes through the window 7 toward the multilayer-film mirror 16 (part of the illumination-optical system). SXR radiation reflected and focused by the multilayer-film mirror 16 propagates to the reflective mask 1 to illuminate a specified illumination field on the mask 1.

Except for their respective numerical apertures, the imaging-optical system 3 of the FIG. 3 embodiment is configured identically to the imaging-optical system 3 of the FIG. 1 embodiment. The numerical aperture of the FIG. 3 embodiment is set to 0.4. Imaging-optical systems 3 having a numerical aperture of 0.4 are well known. For example, the reflective imaging-optical system described, e.g., in U.S. Pat. No. 5,815,310 may be used. The desired numerical aperture may be obtained by providing an aperture as discussed above.

To enable the mirrors 3a–3f to achieve an image resolution of 71 nm or less, they desirably are manufactured such that the form error is less than 0.6 nm (RMS) and the wavefront error of the imaging-optical system 3 is less than 3 nm (RMS). This configuration provides a sufficiently high-resolution microlithographic exposure apparatus even though the magnitude of the form error is not very small.

By setting the numerical aperture to 0.3, the resulting microlithographic exposure apparatus can produce a resolution of 71 nm at wavelengths of less than 43 nm. Even finer resolution can be obtained by setting the numerical aperture greater than 0.3.

Figure 13:
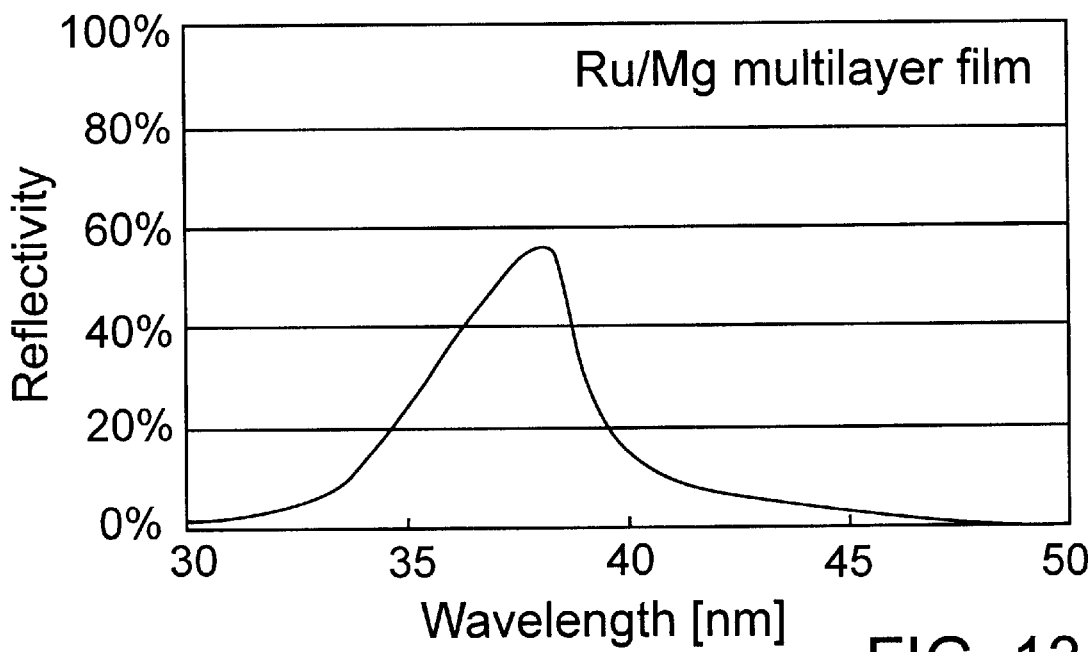
FIG. 13 is a graph of reflective properties of a Ru/Mg multilayer-film reflective mirror at a wavelength range of 30 to 50 nm.

The parabolic mirror 16, the reflective mask 1, and the various mirrors constituting the imaging-optical system 3 desirably are coated with alternating multilayer films of ruthenium (Ru) as the high-refractive-index material and magnesium (Mg) as the low-refractive-index material. Such reflective surfaces are effective for reflecting soft X-rays having a wavelength of about 30 nm. Desirably, the multilayer film comprises 30 lamina sets each including a 5-nm-thick ruthenium layer and a 15-nm-thick magnesium layer. The lamina sets are arranged such that the layers are in alternating order. A plot of calculated values of the reflective properties of such a multilayer film is shown in FIG. 13, in which the peak reflectivity is approximately 57%, and the half-width is approximately 3.9 nm.

Besides ruthenium (Ru), manganese (Mn), yttrium (Y), zirconium (Zr), niobium (Nb), alloys of these elements, and compounds containing these elements can be used as the high-refractive-index material. Besides magnesium, lithium (Li), aluminum (Al), alloys of these elements, and compounds containing these elements can be used as the low-refractive-index material.

Figure 14:
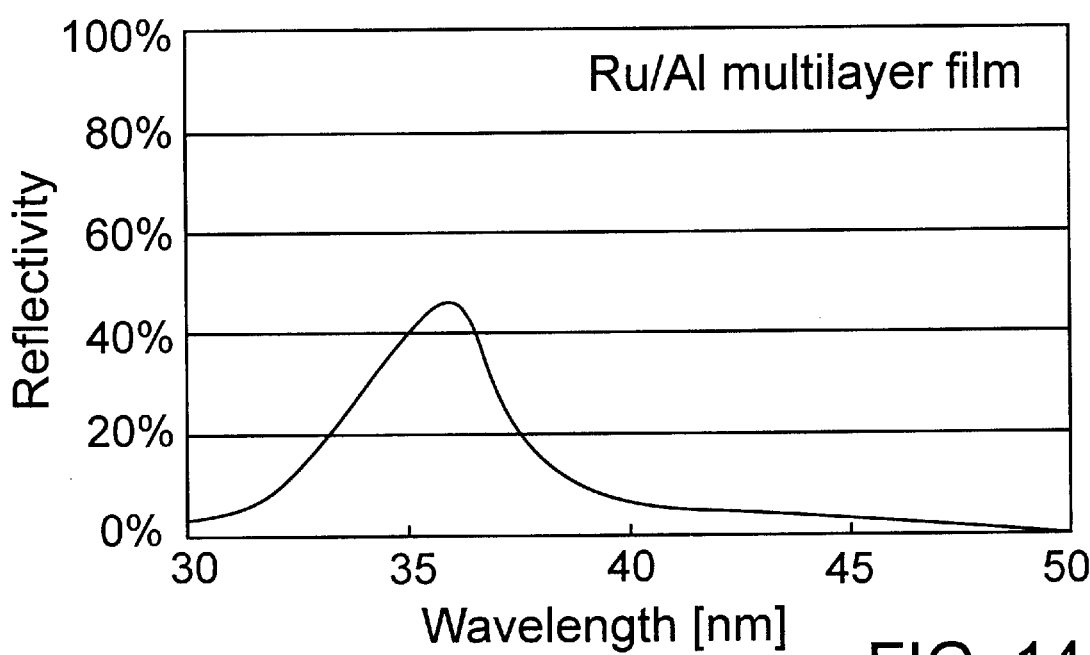
FIG. 14 is a graph of reflective properties of a Ru/Al multilayer-film reflective mirror at a wavelength range of 30 to 50 nm.

A plot of calculated values of the reflective properties of an alternating multilayer film in which ruthenium is the high-refractive-index material and aluminum is the low-refractive-index material is shown in FIG. 14. This multilayer film comprises 30 lamina sets each including a 5-nm-thick ruthenium layer and a 15-nm-thick aluminum layer. The lamina sets are arranged such that the layers are in alternating order. The peak reflectivity is approximately 45% and the half-width is approximately 3.8 nm.

Fourth Representative Embodiment

Figure 4:
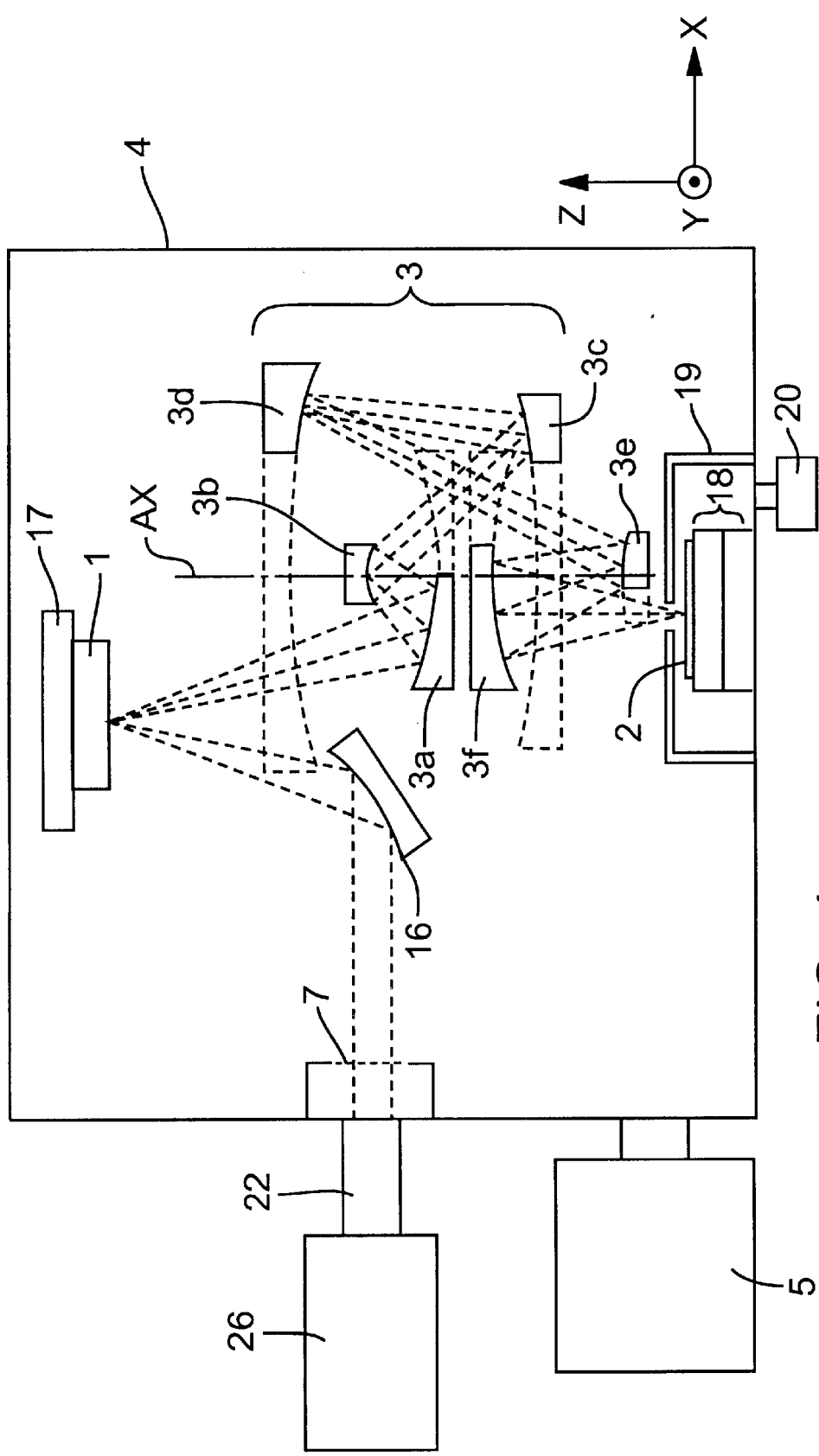
FIG. 4 is a schematic optical diagram of a microlithographic exposure apparatus according to a fourth representative embodiment, employing an X-ray laser source of soft X-rays.

A fourth representative embodiment is depicted in FIG. 4, in which components that are the same as shown in FIG. 1 have the same respective reference numerals and are not described further. The embodiment of FIG. 4 is a step-and-scan system that utilizes SXR radiation having a wavelength of 50 nm as an illumination "light" for exposure.

The exposure "light" source in this embodiment is an X-ray laser 26 employing capillary radiation. Rocca, *SPIE Proc.* 3776:18, 1999. This type of source produces a discharge plasma in a long, slender, hollow electrode in an argon gas atmosphere. The Ne-like argon ions in the plasma produce soft X-rays having a wavelength of 46.9 nm.

SXR "light" from the X-ray laser 26 is conducted to the vacuum chamber 4 through a vacuum conduit 22 through the window 7. The window 7 prevents argon gas used inside the X-ray laser 26 from infiltrating into the vacuum chamber 4.

Except for their respective numerical apertures, the imaging-optical system 3 of the FIG. 4 embodiment is configured identically to the imaging-optical system 3 of the FIG. 1 embodiment. The numerical aperture of the FIG. 4 embodiment is set to 0.5. Imaging-optical systems 3 having a numerical aperture of 0.5 are well known. For example, the reflective imaging-optical system described, e.g., in U.S. Pat. No. 5,815,310 may be used. The desired numerical aperture may be obtained by providing an aperture as discussed above.

To enable the mirrors 3a–3f to achieve an image resolution of 71 nm or less, they desirably are manufactured such that the form error is less than 0.7 nm (RMS) and the wavefront error of the imaging-optical system 3 is less than 3.5 nm (RMS). This configuration provides a sufficiently high-resolution microlithographic exposure apparatus even though the magnitude of the form error is not very small.

By setting the numerical aperture to 0.35, the resulting microlithographic exposure apparatus can produce a resolution of 71 nm at wavelengths of less than 50 nm. Even finer resolution can be obtained by setting the numerical aperture greater than 0.35.

The parabolic mirror 16, the reflective mask 1, and the various mirrors constituting the imaging-optical system 3 desirably are coated with alternating multilayer films of ruthenium (Ru) as the high-refractive-index material and aluminum (Al) as the low-refractive-index material. Such reflective surfaces are effective for reflecting soft X-rays having a wavelength of about 46.9 nm. Desirably, the multilayer film comprises 20 lamina sets each including a 6-nm-thick ruthenium layer and a 19-nm-thick magnesium layer. The lamina sets are arranged such that the layers are in alternating order.

As described above, by using a SXR wavelength selected within the range of 20 nm to 50 nm and forming multilayer films of materials, as listed above, on the various reflective mirrors of the illumination-optical system and imaging-optical system, SXR (EUV) microlithography apparatus are configured that achieve a throughput of, for example, at least 50 12-inch wafers per hour at a resolution of 71 nm or finer.

Fifth Representative Embodiment

This embodiment is directed to methods for manufacturing microelectronic devices using a SXR (EUV) microlithography apparatus as described above.

This embodiment of a microelectronic-device manufacturing process includes the following main steps, each of which comprising a set of respective sub-steps:

(1) Wafer manufacturing and preparation.

(2) Mask manufacturing and preparation.

(3) Wafer processing to form each of the desired microelectronic devices ("chips") on the wafer.

(4) Chip assembly, in which the chips formed on the wafer are cleaved into individual chips and made operable.

(5) Chip inspection, in which the completed chips are inspected and their operability is verified.

Among the main steps listed above, wafer processing is key to achieving the smallest feature sizes (critical dimensions), best inter-layer registration, and best general performance of the microelectronic devices. In the wafer-processing step, multiple circuit patterns are layered successively atop one another on the wafer to form the chips (e.g., microprocessor chips, memory chips), wherein the formation of each layer typically involves multiple sub-steps. Usually, many operative chips are produced on each wafer. Typical wafer-processing steps include:

(1) thin-film formation (by, e.g., CVD or sputtering) involving formation of dielectric layer for electrical insulation or a metal layer for connecting wires or electrodes;

(2) oxidation of the wafer substrate or of the thin-film layer;

(3) microlithography to form a resist pattern (corresponding to the mask pattern) for selective processing of the thin film or the substrate itself;

(4) etching or analogous step (e.g., dry etching) to etch the thin film or substrate according to the resist pattern;

(5) implantation of ions or impurities into the thin film or substrate according to the resist pattern;

(6) resist stripping to remove the resist from the wafer; and (7) chip inspection to verify that steps (1)–(6) achieved the desired results.

The wafer-processing process is repeated as required (typically many times) to fabricate the desired microelectronic devices on the wafer.

Methods and apparatus according to the invention are especially useful in the microlithography step, which is the key step in wafer processing. The microlithography step typically includes the following sub-steps:

(a) resist-application step, wherein a suitable resist is coated on the wafer substrate (which can include circuit elements formed in a previous wafer-processing step);

(b) microlithographic exposure of the resist with the desired mask pattern;

(c) resist development, in which the resist is processed to retain the exposed pattern; and (d) optional annealing step to stabilize the developed pattern in the resist.

Each of the microelectronic-device manufacturing steps outlined above is well-known, and further explanation of them is unnecessary.

In the microelectronic-device manufacturing method summarized above, a microlithography apparatus according to, e.g., any of the representative embodiments described above is used. Performing wafer processing in such a manner allows microelectronic devices to be manufactured having higher levels of integration than conventionally attainable.

As noted above, it is common for the wafer-processing steps to be repeated multiple times so as to overlay multiple circuit patterns accurately on the wafer. However, whenever wafer processing is performed multiple times, the resulting structure as formed on the wafer acquires a height dimension (a difference in elevation between the highest point on the wafer surface and the lowest point on the wafer surface). The depth of focus (DOF) of a microlithography apparatus as described above is a function of illumination-light wavelength ($\lambda$) and numerical aperture (NA) of the imaging-optical system, according to Equation (4):

$$DOF = (k_2)\lambda/(NA)^2 \tag{4}$$

wherein $k_2$ is an empirical coefficient that depends not only on the characteristics of the optical system, but also on the characteristics of the resist. Depths of focus relative to various wavelengths and numerical apertures (where $k_2=1$) are listed in Table 3.

TABLE 3

Depths of Focus at Wavelength Wavelengths ($\lambda$) and Numeric Apertures (NA)

| NA/$\lambda$ | 11 nm | 13 nm | 20 nm | 30 nm | 40 nm | 50 nm |
|---|---|---|---|---|---|---|
| 0.08 | 1.7 μm | 2.0 μm | 3.1 μm | 4.7 μm | 6.3 μm | 7.8 μm |
| 0.10 | 1.1 μm | 1.3 μm | 2.0 μm | 3.0 μm | 4.0 μm | 5.0 μm |
| 0.15 | 0.49 μm | 0.58 μm | 0.89 μm | 1.3 μm | 1.8 μm | 2.2 μm |
| 0.2 | 0.28 μm | 0.33 μm | 0.50 μm | 0.75 μm | 1.0 μm | 1.3 μm |
| 0.25 | 0.18 μm | 0.21 μm | 0.32 μm | 0.48 μm | 0.64 μm | 0.80 μm |
| 0.3 | 0.12 μm | 0.14 μm | 0.22 μm | 0.33 μm | 0.44 μm | 0.56 μm |
| 0.35 | 0.09 μm | 0.11 μm | 0.16 μm | 0.24 μm | 0.33 μm | 0.41 μm |
| 0.4 | 0.07 μm | 0.08 μm | 0.13 μm | 0.19 μm | 0.25 μm | 0.31 μm |
| 0.45 | 0.05 μm | 0.06 μm | 0.10 μm | 0.15 μm | 0.20 μm | 0.25 μm |
| 0.5 | 0.04 μm | 0.03 μm | 0.08 μm | 0.12 μm | 0.16 μm | 0.20 μm |

By viewing Table 3 in comparison with Table 1, the depth of focus is less than 1 μm at a resolution of 71 nm or finer within the wavelength range of 20 nm to 50 nm. Even with such a shallow depth of focus, it is nevertheless necessary to transfer pattern elements, defined by the mask, to the wafer in a manner that achieves accurate pattern-element definition across the entire exposure field of the wafer, especially if wafer processing is repeated multiple times.

Hence, it typically is necessary, especially whenever the wafer-processing step is repeated multiple times, to include a wafer-planarization step before a microlithography step. Wafer planarization typically is performed by wafer polishing (e.g., by chemical mechanical polishing). The wafer planarization step planarizes the pattern structure previously formed on the wafer.

In chemical mechanical polishing (CMP), a polishing pad is adhered to a polishing head. The wafer, mounted to a polishing platen, is urged against the polishing head to which a suitable polishing slurry has been applied. As polishing proceeds, the polishing platen and wafer head undergo rotation about respective axes and relative linear or orbital motion.

Figure 15:
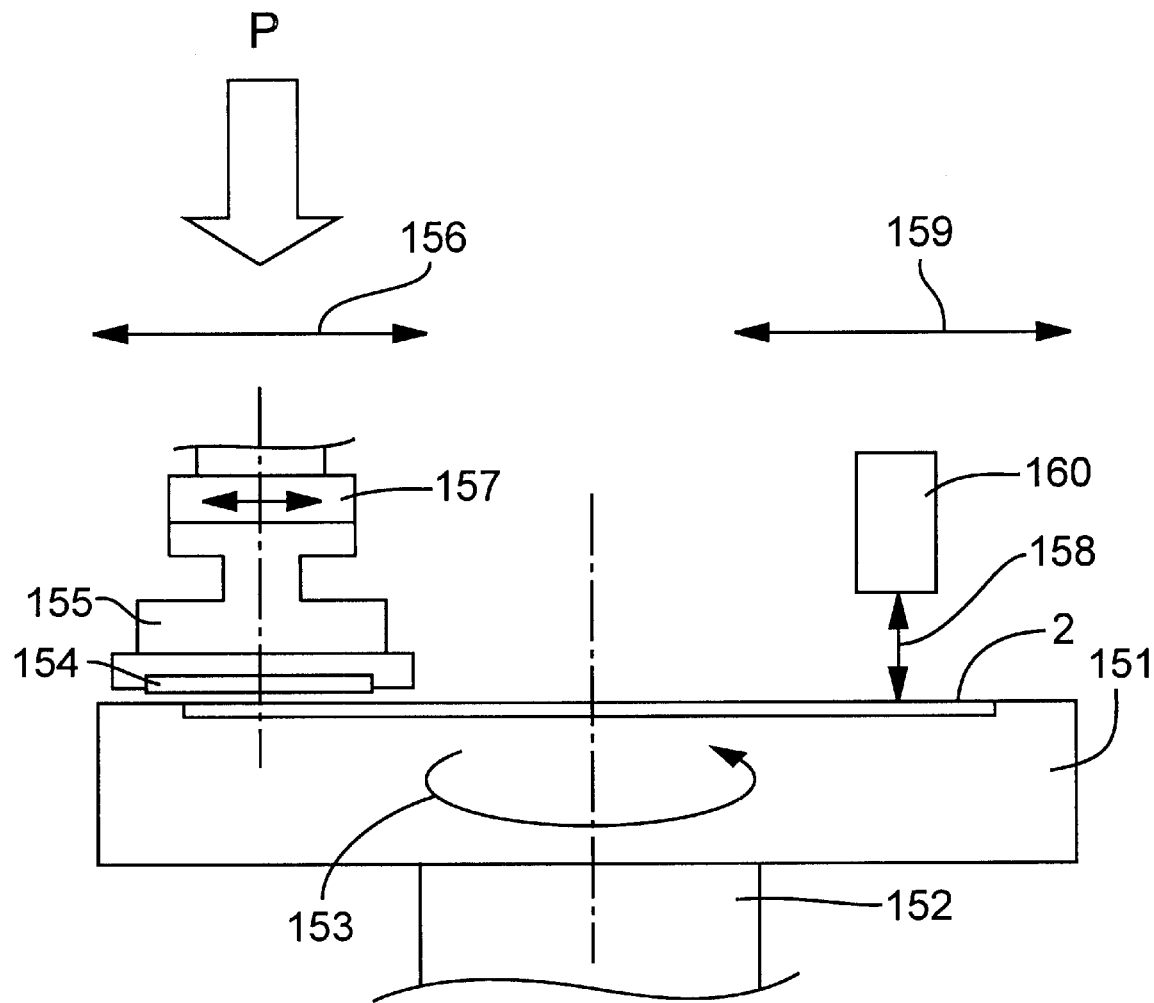
FIG. 15 is a schematic structural drawing of a polishing apparatus as used for chemical mechanical polishing (CMP) of a wafer.

A representative wafer-polishing apparatus that can be used to perform CMP is shown in FIG. 15. The apparatus includes a polishing pad 154 (the pad 154 is depicted smaller than the wafer 2). The polishing pad 154 is mounted to a platen 155 attached to a "vibration" mechanism 157. The vibration mechanism 157 imparts at least a reciprocating motion (small double-headed arrow) and optionally also a rotational motion to the platen 155 (and hence to the polishing pad 154). The vibration mechanism 157 is mounted to a linear-feed mechanism (not shown) that moves the vibration mechanism 157 and the platen 155 across (arrow 256) the surface of the wafer 2. The vibration mechanism 157 also is mounted to a vertical-feed mechanism (not shown) that urges the polishing pad 154 against the surface of the wafer (arrow P). Meanwhile, the wafer 2 is held on a wafer head 151 attached to a rotary shaft 152. The rotary shaft 152 is attached to a rotation mechanism (not shown) configured to rotate the shaft 152 (arrow 153) and hence the wafer head 151 and attached wafer 2 during polishing.

Wafer polishing is achieved by the combined rotation of the wafer 2, vibration of the polishing pad 154, urging of the polishing pad against the wafer 2, and movement of the polishing pad across the surface of the wafer. The polishing apparatus further comprises an optical monitor 160 configured to ascertain the extent of polish of the wafer as the wafer is being polished, and to determine the timing of completion of polishing. To such end, the optical monitor directs a probe light (arrow 158) onto the wafer 2 and monitors changes in reflected light as polishing proceeds. The optical monitor 160 can be moved (arrow 159) across the wafer synchronously with the motion 156 of the polishing pad 154.

Using a wafer-polishing apparatus as described above, planarity of the wafer surface is maintained throughout wafer processing, allowing microlithography to be performed for multiple overlay exposures at a shallow depth of focus.

Conventionally, it was necessary for the resist to have sufficient thickness to withstand dry etching. Under such conditions, microlithography apparatus having large DOF were necessary. From a practical standpoint, however, there are limits to the aspect ratio (ratio of height to width) of a resist pattern that can be developed after exposure (e.g., the thickness of the resist tends to be thinner with more intricate circuit patterns). By performing microlithography according to the present invention, wafer processing is possible that can achieve a pattern resolution of 71 nm and finer, with thinner resists. Under such conditions, the preferred DOF of the microlithography apparatus is approximately 0.2 $\mu$m or more.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. A microlithography apparatus for forming an image, on a resist-coated substrate, of a pattern defined by a mask, the apparatus comprising:

an illumination-optical system situated and configured to direct an illumination light, having a wavelength within a range of 20 nm to 50 nm, from a source of the illumination light to a mask; and an imaging-optical system comprising multiple reflective mirrors having at least one aspherical surficial profile, the imaging-optical system being situated and configured to direct an imaging light, propagating from the mask, to a substrate so as to achieve a pattern-element resolution of 70 nm or finer.

2. The apparatus of claim 1, further comprising an illumination-light source situated and configured to produce the illumination light and to direct the illumination light to the illumination-optical system.

3. The apparatus of claim 2, wherein the illumination-light source is selected from the group consisting of laser-plasma X-ray sources, discharge-plasma light sources, synchrotron-radiation sources, and X-ray lasers.

4. The apparatus of claim 1, wherein:

the illumination-optical system is configured to direct the illumination light to a reflective mask; and the imaging-optical system is configured to receive the imaging light, formed by reflection of the illumination light from the mask, and to direct the imaging light to the substrate.

5. The apparatus of claim 1, wherein:

the illumination light has a wavelength within a range of 20 nm to 22 nm; and the imaging-optical system has a numerical aperture of at least 0.15.

6. The apparatus of claim 1, wherein:

the illumination light has a wavelength within a range of 20 nm to 36 nm; and the imaging-optical system has a numerical aperture of at least 0.25.

7. The apparatus of claim 1, wherein:

the illumination light has a wavelength within a range of 20 nm to 43 nm; and the imaging-optical system has a numerical aperture of at least 0.3.

8. The apparatus of claim 1, wherein:

the illumination light has a wavelength within a range of 20 nm to 50 nm; and the imaging-optical system has a numerical aperture of at least 0.35.

9. The apparatus of claim 1, wherein:

the imaging-optical system comprises multiple multilayer-film reflective mirrors each having, as a respective reflective surface, an aspherical surface coated with a respective multilayer film, the multilayer film comprising multiple sets of alternating layers of a first material having a refractive index that is greatly different from the refractive index of a vacuum and of a second material having a refractive index that is slightly different from the refractive index of a vacuum;

the first material is selected from the group consisting of boron, ruthenium, manganese, yttrium, zirconium, niobium, and alloys and compounds thereof; and the second material is selected from the group consisting of lithium, magnesium, aluminum, and alloys and compounds thereof.

10. A microlithography apparatus for forming an image, on a resist-coated substrate, of a pattern defined by a mask, the apparatus comprising:

an illumination-optical system situated and configured to direct an illumination light, having a wavelength within a range of 20 nm to 50 nm, from a source of the illumination light to a mask; and an imaging-optical system situated and configured to direct an imaging light, propagating from the mask, to a substrate, the imaging-optical system having a numerical aperture of at least 0.15.

11. The apparatus of claim 10, wherein:

the imaging-optical system comprises multiple multilayer-film reflective mirrors each having, as a respective reflective surface, an aspherical surface coated with a respective multilayer film, the multilayer film comprising multiple sets of alternating layers of a first material having a refractive index that is greatly different from the refractive index of a vacuum and of a second material having a refractive index that is slightly different from the refractive index of a vacuum;

the first material is selected from the group consisting of boron, ruthenium, manganese, yttrium, zirconium, niobium, and alloys and compounds thereof; and the second material is selected from the group consisting of lithium, magnesium, aluminum, and alloys and compounds thereof.

12. The apparatus of claim 10, further comprising an illumination-light source situated and configured to produce the illumination light and to direct the illumination light to the illumination-optical system.

13. The apparatus of claim 12, wherein the illumination-light source is selected from the group consisting of laser-plasma X-ray sources, discharge-plasma light sources, synchrotron-radiation sources, and X-ray lasers.

14. A method for manufacturing a microelectronic device, comprising:

directing a soft X-ray beam to a mask defining a pattern, the soft X-ray beam having a wavelength in a range of 20 nm to 50 nm; and projecting soft X-ray light from the mask onto a resist-coated wafer so as to form an image of the pattern on the wafer at a resolution of 70 nm or finer.

15. A method for manufacturing a microelectronic device, comprising:

directing a soft-X-ray beam to a mask defining a pattern, the soft X-ray beam having a wavelength within a range of 20 nm to 50 nm; and passing soft X-ray light from the mask through an imaging-optical system onto a resist-coated wafer so as to form an image of the pattern on the wafer, the imaging-optical system having a numerical aperture of at least 0.15.

16. A method for manufacturing a microelectronic device, comprising:

providing an imaging-optical system configured to project a soft X-ray beam, having a wavelength in a range of 20 nm to 50 nm and propagating from a pattern-defining mask, to form an image of the pattern on a substrate, the imaging-optical system being configured to have a numerical aperture of at least 0.15;

after previously applying a patterned layer to a substrate, polishing the substrate and applying a layer of a resist on the polished substrate;

directing a soft X-ray illumination beam to the mask; and passing soft X-ray light from the mask through the imaging-optical system onto the resist-coated substrate so as to form an image of the pattern on the substrate, the image overlaying the previously applied patterned layer on the substrate.

* * * * *